United States Patent
Kim et al.

(10) Patent No.: US 11,380,471 B2
(45) Date of Patent: Jul. 5, 2022

(54) RF DAMPING STRUCTURE IN INDUCTIVE DEVICE

(71) Applicant: QUALCOMM Incorporated, San Diego, CA (US)

(72) Inventors: Daniel Daeik Kim, Del Mar, CA (US); Bonhoon Koo, San Diego, CA (US); Babak Nejati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 930 days.

(21) Appl. No.: 16/034,653

(22) Filed: Jul. 13, 2018

(65) Prior Publication Data

US 2020/0020474 A1 Jan. 16, 2020

(51) Int. Cl.
| | |
|---|---|
| H01F 27/28 | (2006.01) |
| H01F 17/02 | (2006.01) |
| H03F 1/08 | (2006.01) |
| H01F 17/00 | (2006.01) |
| H03F 3/19 | (2006.01) |
| H03F 3/21 | (2006.01) |

(52) U.S. Cl.
CPC ............... *H01F 17/02* (2013.01); *H03F 1/08* (2013.01); *H01F 27/2804* (2013.01); *H01F 2017/0046* (2013.01); *H01F 2017/0093* (2013.01); *H01F 2027/2809* (2013.01); *H01F 2027/2819* (2013.01); *H03F 3/19* (2013.01); *H03F 3/21* (2013.01); *H03F 2200/301* (2013.01); *H03F 2200/387* (2013.01); *H03F 2200/451* (2013.01)

(58) Field of Classification Search
CPC ............. H01F 17/02; H01F 2017/0093; H01F 17/0013; H01F 2017/0046; H01F 2017/0073; H01F 17/0006; H01F 27/27; H01F 27/2804; H01F 2027/2809; H01F 2027/2819; H03F 1/08; H03F 3/19; H03F 3/21; H03F 2200/301; H03F 2200/387; H03F 2200/451; H03F 1/565
See application file for complete search history.

(56) References Cited

U.S. PATENT DOCUMENTS

| | | | |
|---|---|---|---|
| 2006/0284719 A1 | 12/2006 | Lee | |
| 2015/0002213 A1* | 1/2015 | Zhang | H01L 28/10 327/525 |
| 2016/0027571 A1* | 1/2016 | Zhang | H01F 19/04 336/173 |

FOREIGN PATENT DOCUMENTS

| | | | |
|---|---|---|---|
| JP | 2004095777 A | * | 3/2004 |
| JP | 2009105462 A | * | 5/2009 |

* cited by examiner

*Primary Examiner* — Tuyen T Nguyen
(74) *Attorney, Agent, or Firm* — Qualcomm Incorporated

(57) ABSTRACT

A spiral inductor includes a spiral trace and a plurality of first projections extending along a first edge of the spiral trace. The spiral inductor may further include a plurality of second projections extending along a second edge of the spiral trace, the second edge being opposite the first edge.

17 Claims, 9 Drawing Sheets

US 11,380,471 B2

1

RF DAMPING STRUCTURE IN INDUCTIVE DEVICE

TECHNICAL FIELD

The present disclosure generally relates to choke inductors. More specifically, the present disclosure relates to low direct current (DC) resistance and high radio frequency (RF) resistance power amplifier (PA) choke inductors.

BACKGROUND

A choke is an inductor used to block higher frequency alternating current in an electrical circuit, while passing a lower frequency current (e.g., direct current). In conventional systems, a choke is a coil of insulated wire wound on a magnetic core. Some choke inductors may be spiral inductors or co-spiral inductors.

To achieve stability in an amplifier, such as a radio frequency front end (RFFE) power amplifier, it is desirable to use a radio frequency choke with low DC resistance and high RF resistance. The low DC resistance reduces voltage degradation at the power amplifier output. Conventional printed inductors may be unstable due to a high quality (Q) factor (e.g., greater than twenty). A high RF resistance or low Q factor is desirable to reduce radio frequency swing and to improve stability. It would be desirable to provide a RF choke inductor with low DC resistance and high RF resistance for an RFFE power amplifier.

SUMMARY

In one aspect of the present disclosure, a spiral inductor is disclosed. The spiral inductor includes a spiral trace and a plurality of first projections extending along a first edge of the spiral trace. The spiral inductor may further include a plurality of second projections extending along a second edge of the spiral trace, where the second edge is opposite the first edge.

Another aspect of the present disclosure is directed to a co-spiral inductor. The co-spiral inductor includes a first spiral trace and a second spiral trace disposed over the first spiral trace. Each of the first spiral trace and the second spiral trace includes a plurality of first projections extending along a first edge of the spiral trace. Each of the first spiral trace and the second spiral trace may further include a plurality of second projections extending along a second edge of the spiral trace, where the second edge is opposite the first edge.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is

2 provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. Further design challenges for mobile RF transceivers include analog/RF performance considerations, such as mismatch, noise, and other performance considerations. To achieve amplifier stability for a radio frequency chip, such as a radio frequency front end (RFFE) power amplifier (PA), it is desirable to use an RF choke with low DC resistance and high RF resistance (e.g., low-Q). In the following description, an RF choke inductor is also referred to as an RF choke, a PA choke inductor, a driving amplifier (DA) choke inductor, or a DA/PA/RF choke.

Conventional RF chokes use a spiral or co-spiral design. For conventional RF chokes, the quality (Q) factor at 800 MHz is greater than twenty nine. Furthermore, for conventional RF chokes, the DC resistance, at 80 C, is greater than or equal to 75 mOhm. Conventional RF chokes do not achieve both low DC resistance and high RF resistance (lower Q factor).

Figure 1:
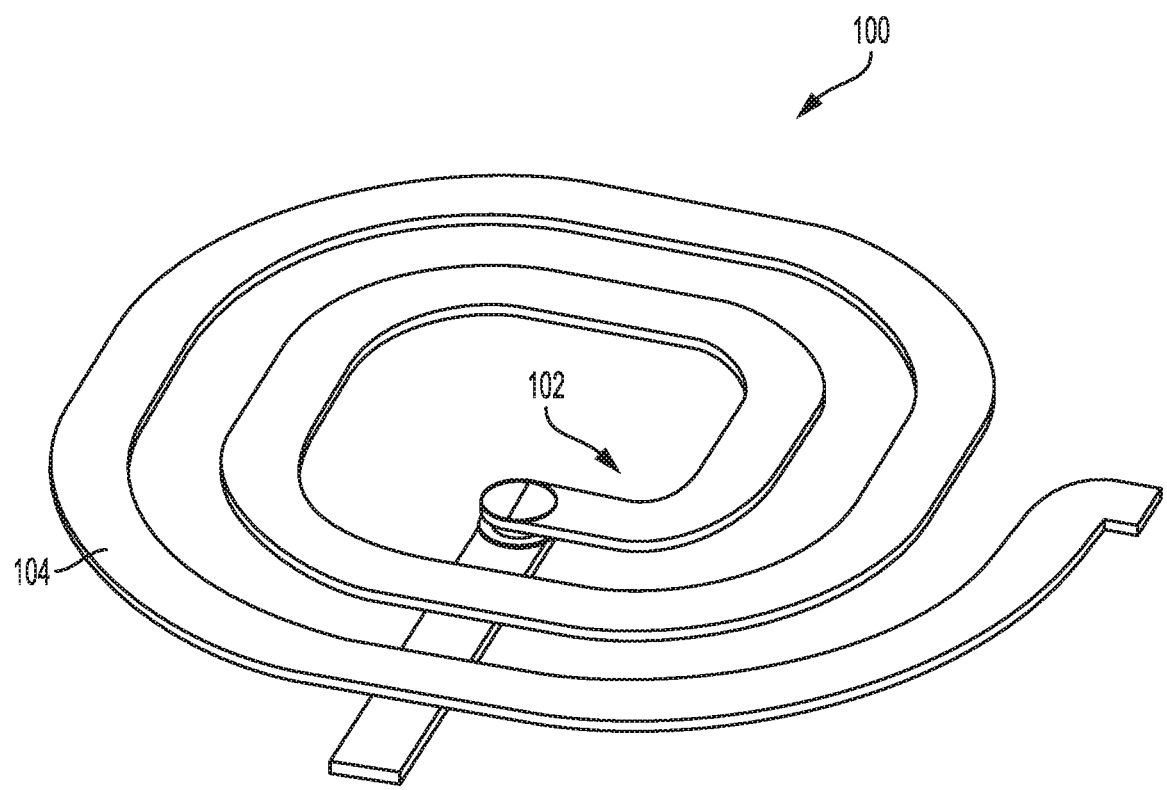
FIG. 1 illustrates an example of a conventional spiral inductor.

FIG. 1 illustrates an example of a conventional spiral inductor 100. As shown in FIG. 1, the spiral inductor 100 has two and a quarter turn. In this example, the spiral inductor has a low-Q area 102 and high-Q area 104. The low-Q area 102 has a smaller radius than the high-Q area 104. Due to limitations of conventional systems (e.g., surface mount devices (SMDs) or laminate printed inductors), conventional RF choke inductors do not achieve low DC resistance ($R_{dc}$) and high RF resistance ($R_{rf}$) (e.g., low-Q).

In some cases, oscillation may be caused by a DA/PA/RF choke with a high quality (Q) factor connected to the power amplifier. That is, a high Q factor may cause a high gain. An increased amount of gain may cause feedback, which may cause instability. As such, a high Q factor may cause the power amplifier to be unstable. In one configuration, to provide stability, a power amplifier choke (e.g., DA/PA/RF choke) inductor is provided between the output of the supply voltage and the output of the driving amplifier and/or power amplifier. A choke may provide RF gain. To improve stability, a resistor may be inserted to reduce the Q factor of a choke. The resistor may reduce DC resistance. The PA/RF choke may have a low DC resistance to reduce a voltage drop at a power amplifier, while having high RF resistance (e.g., low Q factor—e.g., less than 10 or 15) to stabilize the power amplifier (e.g., reduce oscillation, reduce RF swing). High DC resistance may cause an inductor to increase power consumption, which causes a drop in voltage for a power amplifier (e.g., voltage degradation at the output of the power amplifier).

Figure 2:
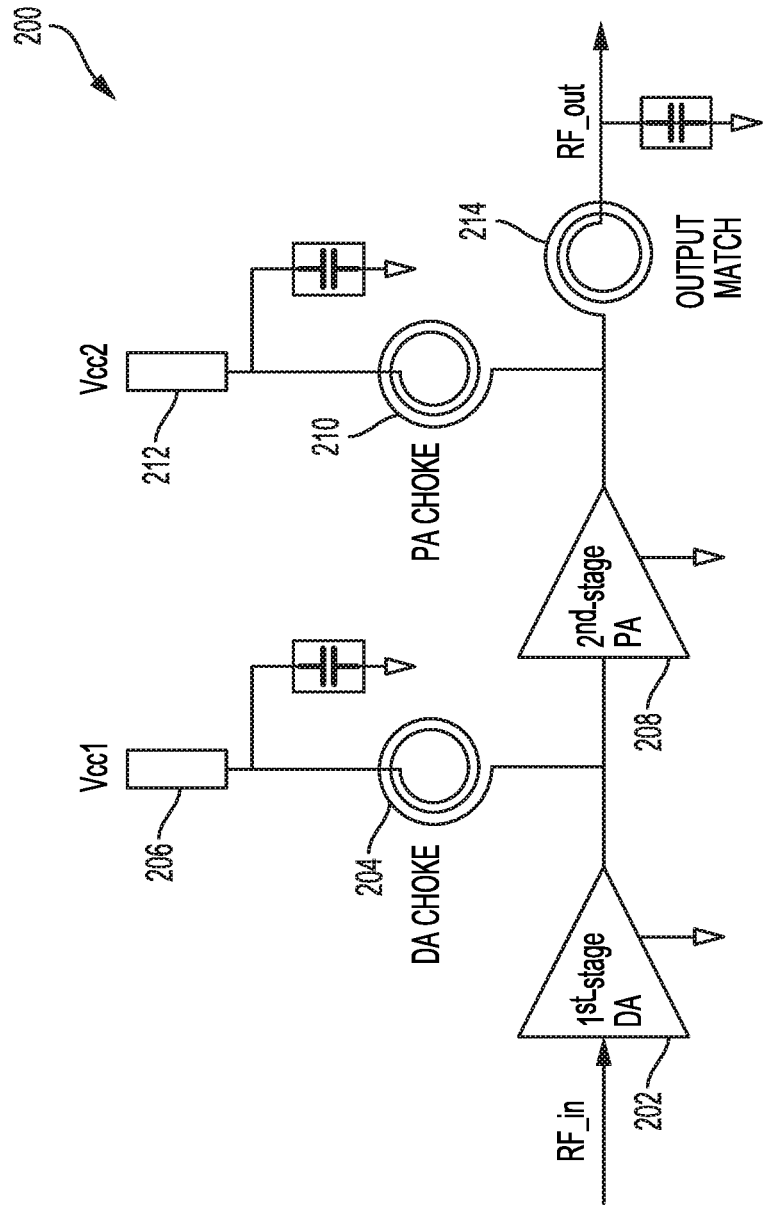
FIG. 2 illustrates an example of a circuit according to aspects of the current disclosure.

FIG. 2 illustrates an example of a portion of a circuit 200 according to aspects of the current disclosure. As shown in FIG. 2, an RF signal is sent to a first stage driving amplifier (DA) 202, which amplifies the signal. A DA choke inductor 204 may be biased from a supply voltage 206 and provides gain to the DA 202. The output of the DA choke inductor 204 is connected to the output of the first stage DA 202. The combined output of the DA choke inductor 204 and the first stage DA 202 is sent to a second stage power amplifier (PA) 208, which amplifies the signal. A PA choke inductor 210 may be biased from a supply voltage 212. The output of the PA choke inductor 210 is connected to the output of the second stage PA 208, and the combined output is sent to a PA output match inductor 214, which couples to a radio frequency output (e.g., RF_out).

In conventional systems oscillations may be caused by the DA choke inductor 204 connected to the first stage DA 202 and by the PA choke inductor 210 connected to the second stage PA 208, when the choke inductors 204 and 210 have a high quality factor. In one configuration of the present disclosure, the DA/PA/RF choke inductors 204 and 210 have a low DC resistance, while having high RF resistance, to stabilize the power amplifier 208 and to reduce voltage degradation.

Aspects of the present disclosure are directed to an RF choke inductor including projections, or damping shapes, extending from one or both edges of a spiral trace. The projections utilize the skin effect to reduce the Q factor of the RF choke inductor. "Skin effect" is the tendency of an alternating electric current to become distributed within a conductor such that the density is largest near the surface of the conductor and decreases with greater depths in the conductor. RF signals travel along the surface due to skin effect. The projections, or damping structures, slow down the RF signal and increase the RF resistance of the RF choke inductor. The Q factor is reduced without significantly impacting the DC resistance. For example, at 80 C, the Q factor of an RF choke that includes these projections or damping structures may be reduced by 20-35% as compared to a similar RF choke that lacks projections, thereby improving stability of the power amplifier. Alternatively, for an equivalent Q factor, the addition of these projections or damping structures may lower the DC resistance by 20-35% of the RF choke, which improves the power amplifier efficiency.

Figure 3:
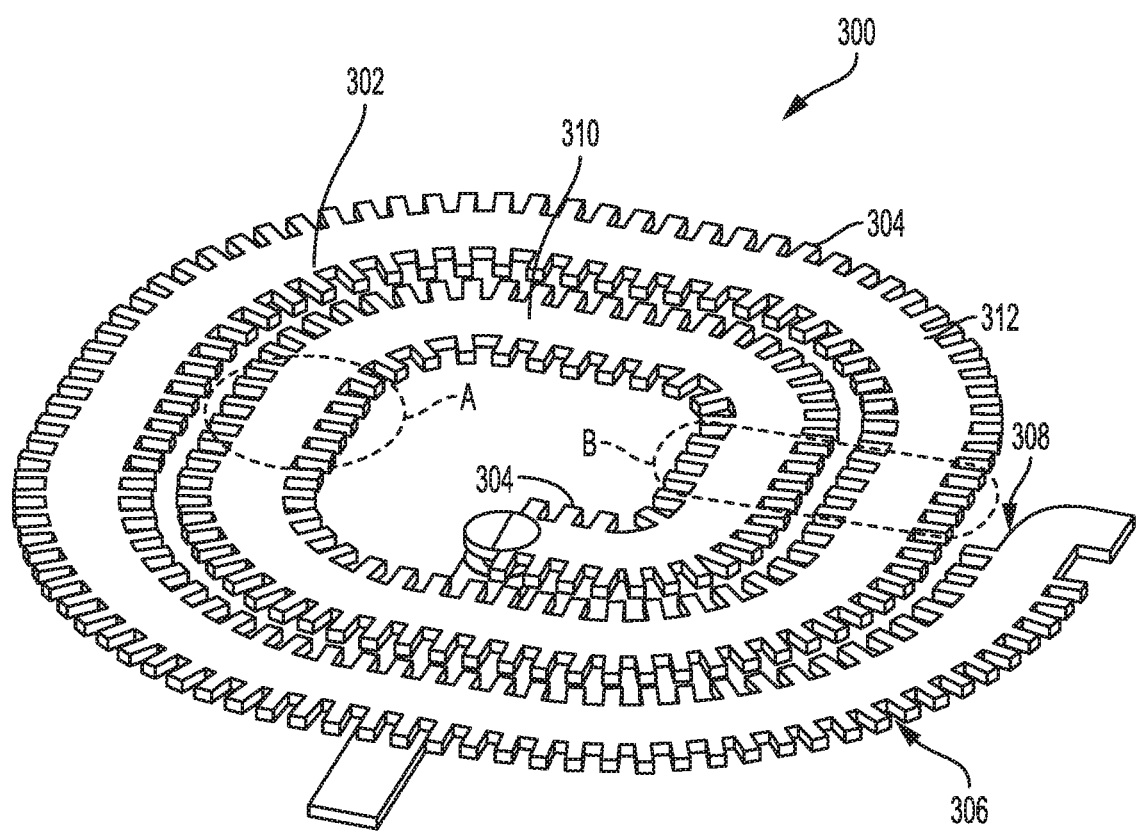
FIG. 3 illustrates an example of a spiral inductor according to aspects of the present disclosure.

FIG. 3 illustrates an example of a spiral inductor 300 according to aspects of the present disclosure. The spiral inductor 300 includes a spiral trace 302. The spiral trace 302 may include any number of turns. As shown in FIG. 3, the spiral trace 302 has two and one quarter turns, however, the spiral trace 302 may have more or fewer turns. The spiral inductor 300 may further include a plurality of projections or damping structures 304 along the spiral trace 302. The projections 304 may extend horizontally (i.e., in plane) from a first edge 306 and a second edge 308 of the spiral trace 302.

Figure 4:
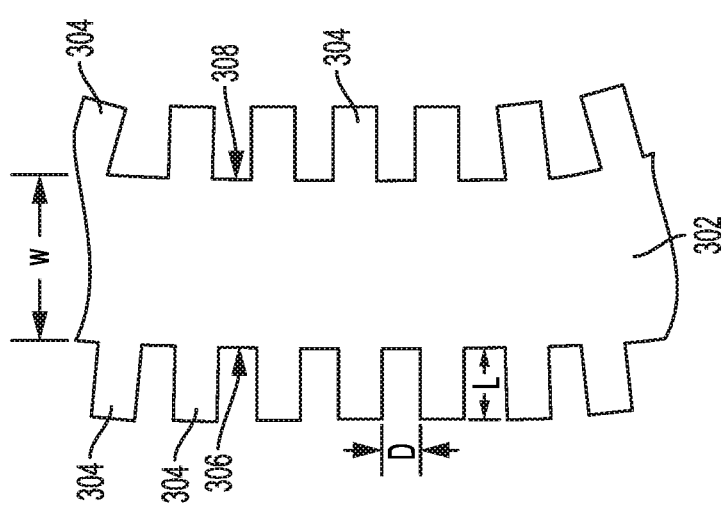
FIG. 4 illustrates a close up of section A of the spiral inductor of FIG. 3.

FIG. 4 provides a close up view of a section A of the spiral inductor 300 of FIG. 3. The spiral trace 302 has a width W that selected to constrain the travel of RF signals along the first and second edges 306 and 308, respectively, of the spiral trace. If the width W of the spiral trace 302 is too wide, then the RF signal will travel along the top and bottom of the trace 302 instead of along the side edges 306, 308 and the projections 304. One exemplary range for the width W of the spiral trace 302 may be 50-150 µm.

The projections 304 are shown along both the first edge 306 and the second edge 308 of the spiral trace 302. Any number of projections 304 may be provided. As shown in FIG. 4, the projections 304 have a generally rectangular shape, although other shapes may be provided. For example, saw-tooth shaped and finger-like projections may also be used. Preferably, a ratio of a length L of a projection 304 to a distance D between adjacent projections is at least 1:1. For example, if the distance D between two adjacent projections is 25 µm, then the length L of the projection 304 is at least 25 µm.

The projections 304 may be provided along both the first and second edges 306 and 308, respectively, or along only one edge. The projections 304 act as damping structures to slow the speed of RF signals travelling along the spiral inductor 300. RF signals travel along the surface of the spiral trace 302 and along the projections 304 to increase the RF resistance of the spiral inductor 300 and lower its Q factor. The DC resistance of the spiral inductor 300, however, remains largely unaffected by the addition of the projections 304. For example, for a spiral inductor having an inductance of around 5 nH, the addition of the projections 304 may achieve a 20-35% lower Q factor than for a similar spiral inductor lacking such projections, while the DC resistance remains largely unchanged.

Figure 5:
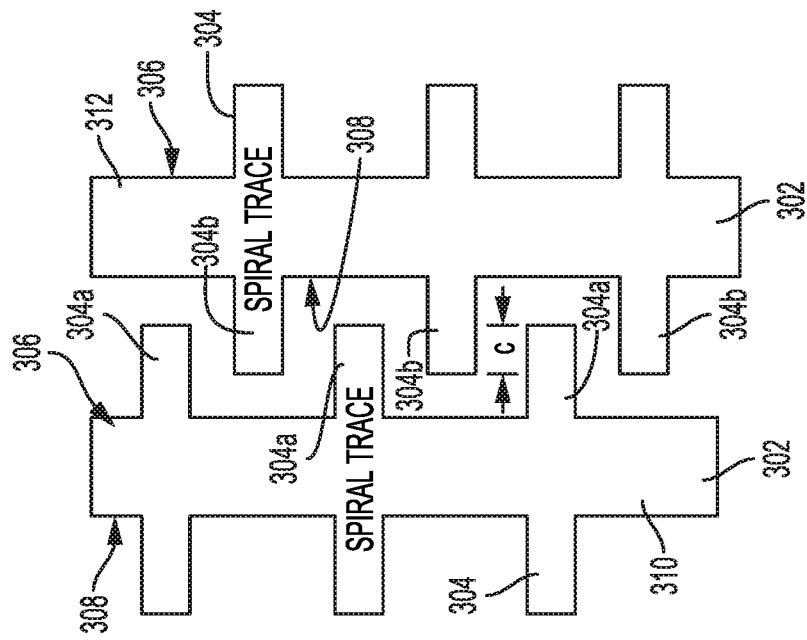
FIG. 5 illustrates an alternate configuration of section B of the spiral inductor of FIG. 3 according to aspects of the present disclosure.

As shown in FIG. 3, the spiral trace 302 has an inner, first turn 310 and a second turn 312 adjacent the first turn 310. The projections 304 along the first edge 306 of the first turn 310 are spaced apart from the projections 308 along the second edge 308 of the second turn 312. FIG. 5 illustrates an alternative arrangement in which the projections 304a along the first edge 306 of the first turn 310 are interlaced, or interdigitated, with the projections 304b along the second edge 308 of the second turn 312. A portion of the projections 304a from the first turn 310 of the spiral trace 302 overlap with a portion of the projections 304b from the second turn 312 by a length C to create additional capacitance and provide further degradation of the Q factor for the spiral inductor 302.

Figure 6:
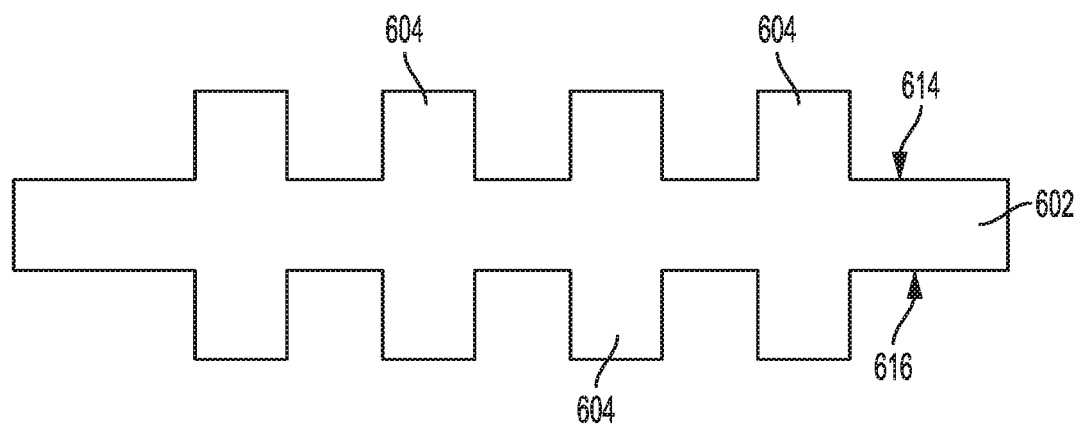
FIG. 6 is a cross-sectional view of a portion of the spiral inductor of FIG. 3, illustrating an alternate configuration according to aspects of the present disclosure.

Projections or damping structures may also extend from the top and bottom surfaces of spiral trace 302, instead of horizontally from side edges 306 and 308 (as shown in FIG. 3). FIG. 6 is a cross-sectional view of a portion of a spiral trace 602 of a spiral inductor. The spiral trace 602 has a top surface 614 and a bottom surface 616. If projections 604 are provided along top and bottom surface 614 and 616, respectively, instead of along side edges as shown in FIG. 3, then the width of the spiral trace 602 should be adjusted accordingly to encourage the RF signal to travel along the top and bottom surfaces 614 and 616, respectively, of the spiral trace 602 instead of the side edges.

Figure 7:
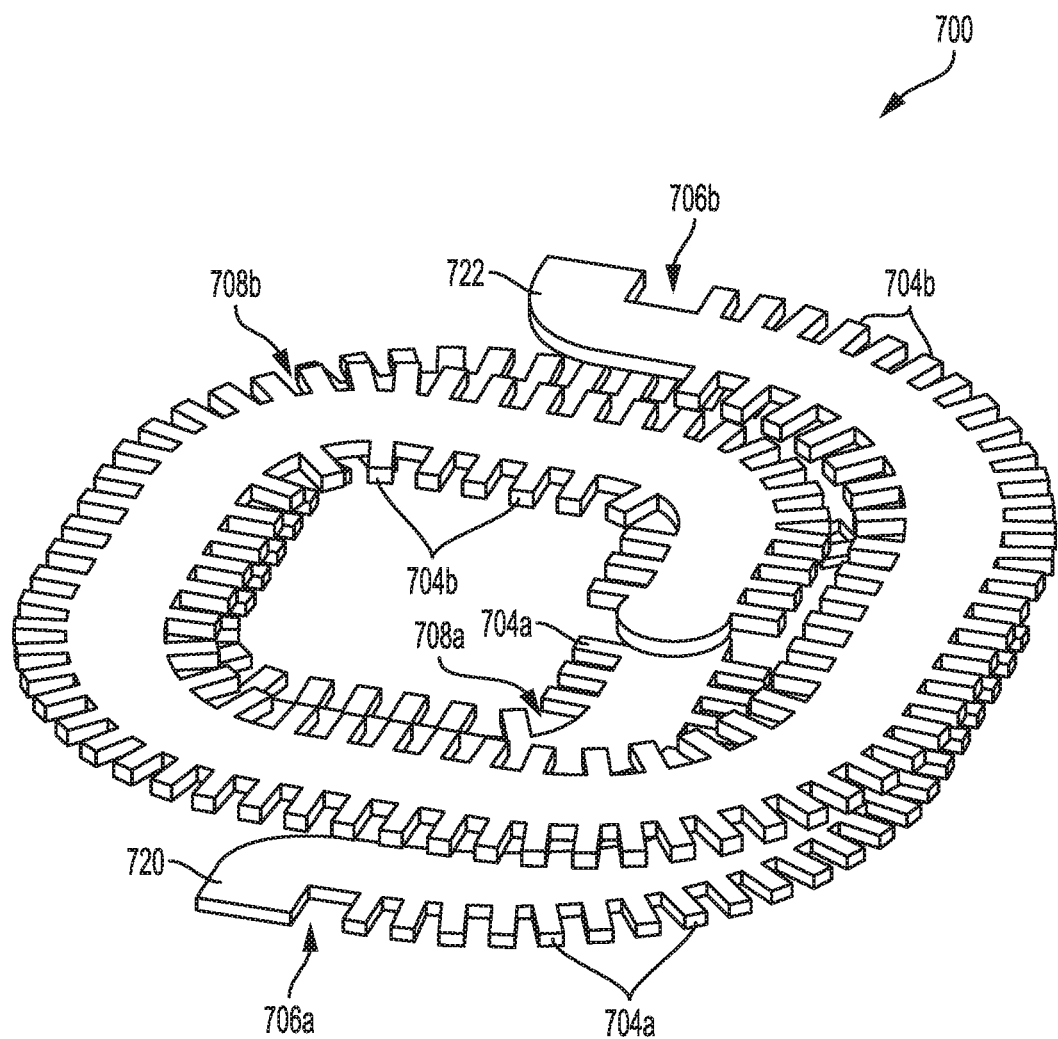
FIG. 7 illustrates an example of a co-spiral inductor according to aspects of the present disclosure.

FIG. 7 illustrates an example of a co-spiral inductor 700 according to aspects of the present disclosure. The co-spiral inductor 700 includes a first spiral trace 720 and a second spiral trace 722. The second spiral trace 722 may be disposed above the first spiral trace 720. Although the co-spiral inductor 700 is shown as having only two spiral traces 720 and 722, additional spiral traces may be disposed above the first and second spiral traces 720 and 722, respectively.

Each of the first spiral trace 720 and the second spiral trace 722 may include a plurality of projections 704a and 704b, respectively. As shown in FIG. 7, the first spiral trace 720 may include projections 704a extending from both a first edge 706a and a second edge 708a of the first spiral trace 720. Similarly, the second spiral trace 722 may include projections 704b extending from both a first edge 706b and a second edge 708b of the second spiral trace 722. Alternatively, one or both of the first and second spiral traces 720 and 722, respectively, may have projections extending along only one edge.

The projections 704a, 704b are similar to the projections 304 discussed above and act as damping structures to slow the speed of RF signals travelling along the co-spiral inductor 700. RF signals travel along the surface of the first and second spiral trace 720 and 722, respectively, and along the projections 704a and 704b to increase the RF resistance of the co-spiral inductor 700 and lower its Q factor. The DC resistance of the co-spiral inductor 700, however, remains largely unaffected by the addition of the projections 704a, 704b. For example, for a spiral inductor having an inductance of around 5 nH, the addition of the projections 704a, 704b may achieve a 20-35% lower Q factor than for a similar spiral inductor lacking such projections, while the DC resistance remains largely unchanged.

Figure 8:
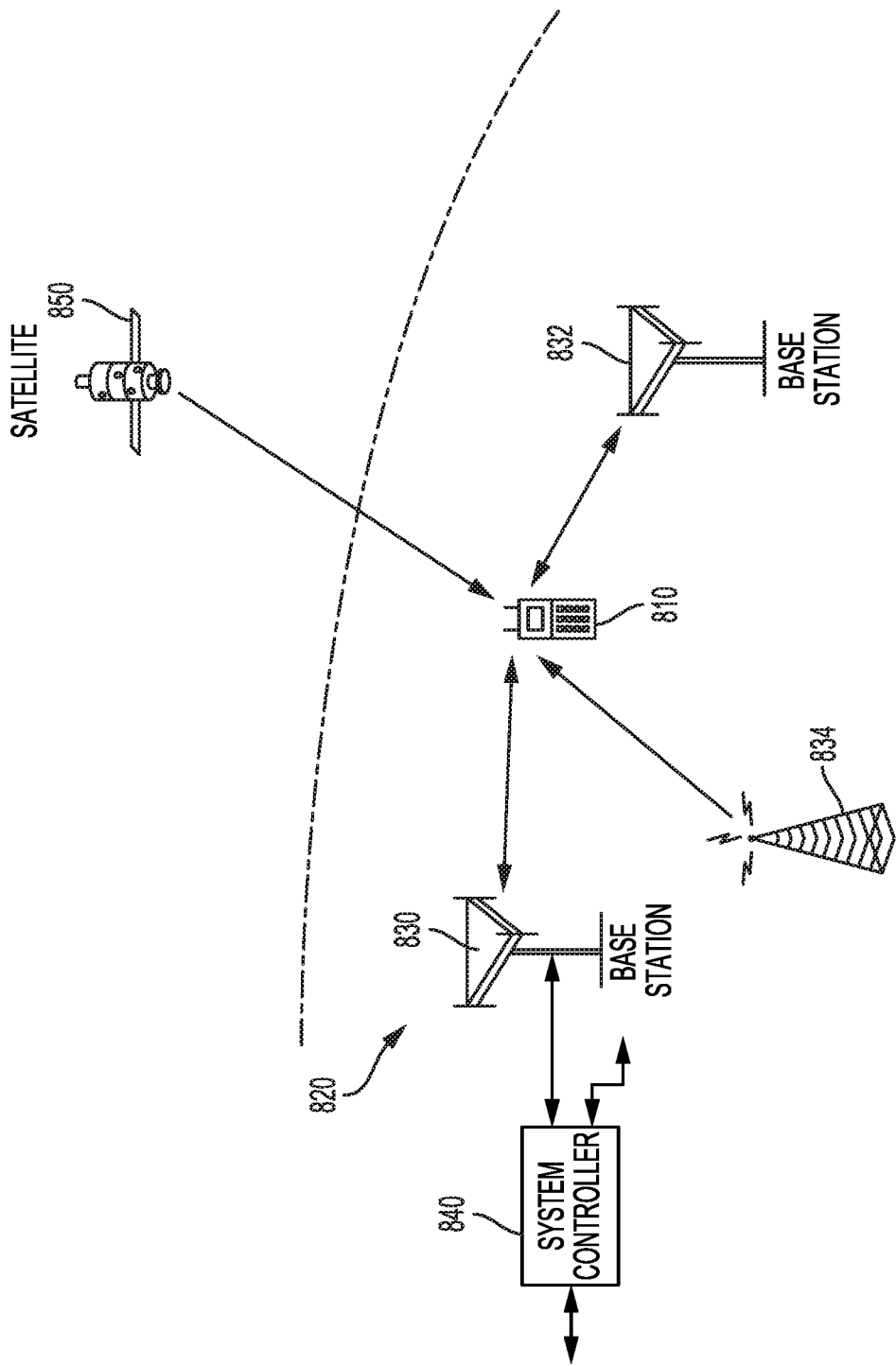
FIG. 8 shows a wireless device communicating with a wireless communication system.
Figure 9:
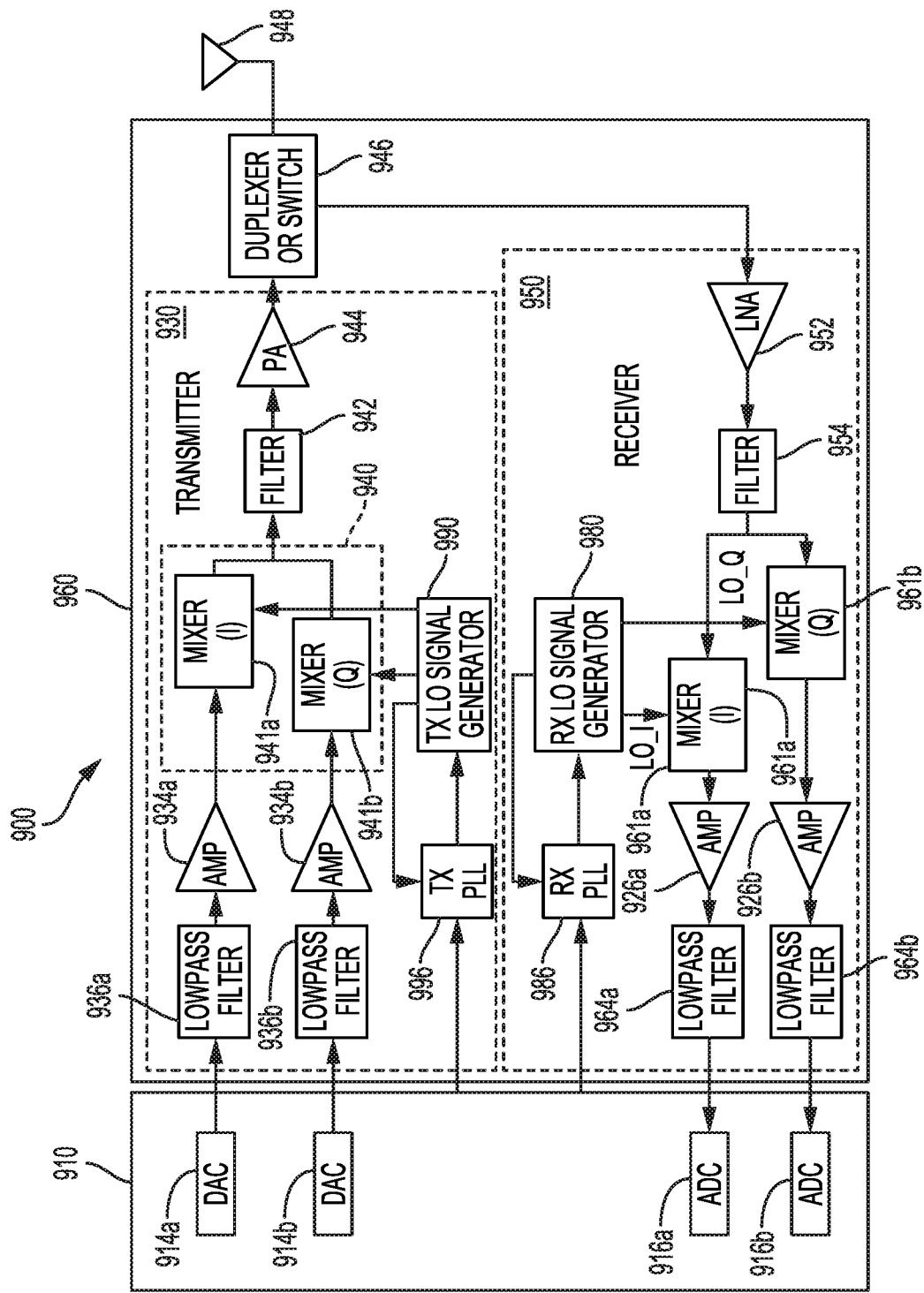
FIG. 9 shows a block diagram of the wireless device in FIG. 8, according to an aspect of the present disclosure.
Figure 10:
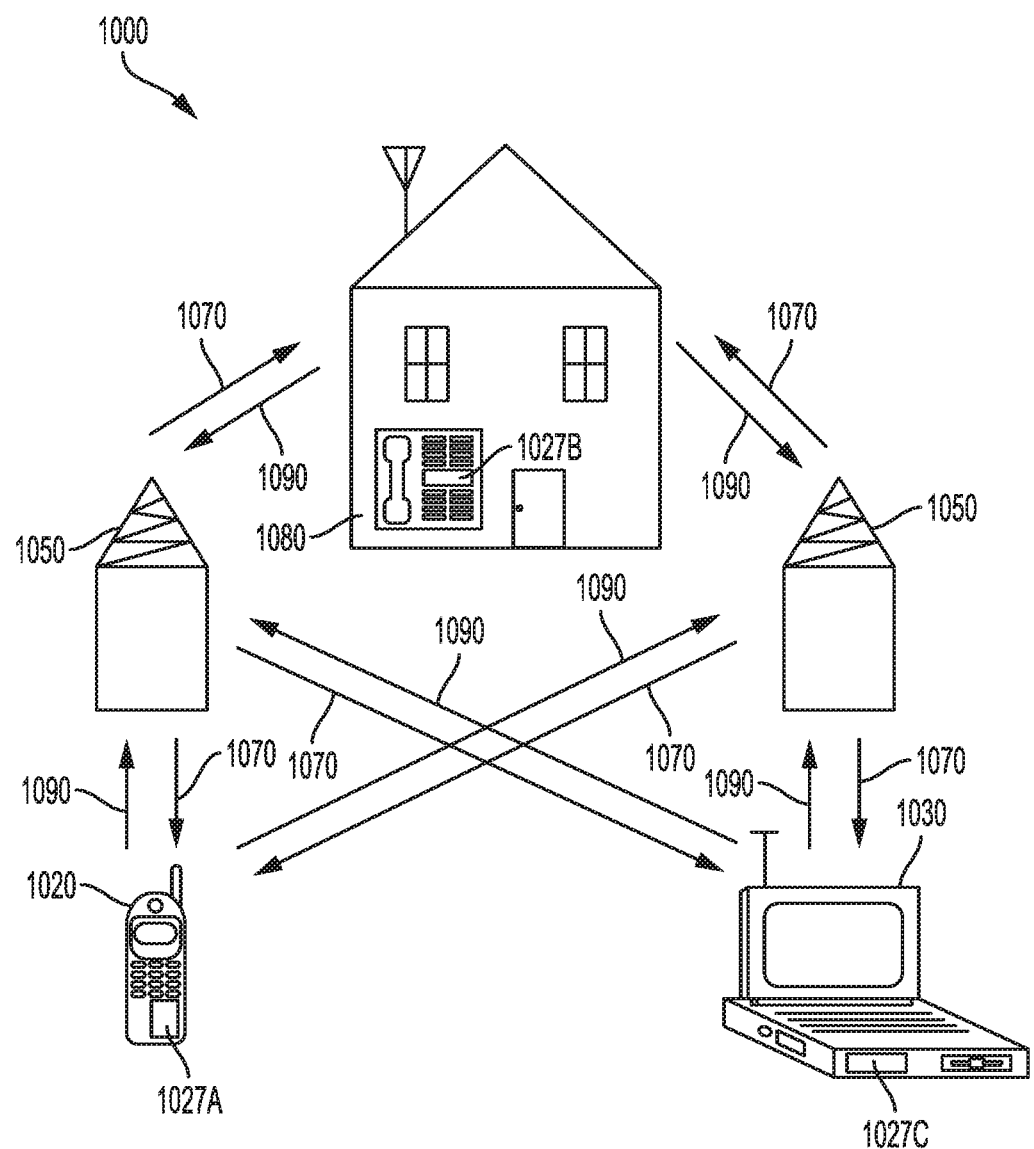
FIG. 10 is a block diagram showing an exemplary wireless communication system in which a configuration of the disclosure may be advantageously employed.

The present disclosure may be implemented in the system of FIGS. 8 and 10. More specifically, the present disclosure may be implemented in the wireless device of FIG. 9.

FIG. 8 shows a wireless device 810 communicating with a wireless communication system 820. The wireless communication system 820 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 8 shows the wireless communication system 820 including two base stations 830 and 832 and one system controller 840. In general, a wireless system may include any number of base stations and any number of network entities.

A wireless device 810 may be referred to as a user equipment (UE), a mobile station, a terminal, an access terminal, a subscriber unit, a station, etc. The wireless device 810 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 810 may be capable of communicating with the wireless communication system 820. The wireless device 810 may also be capable of receiving signals from broadcast stations (e.g., a broadcast station 834), signals from satellites (e.g., a satellite 850) in one or more global navigation satellite systems (GNSS), etc. The wireless device 810 may support one or more radio technologies for wireless communication such as LTE, CDMA2000, WCDMA, TD-SCDMA, GSM, 802.11, etc.

The wireless device 810 may support carrier aggregation, which is operation on multiple carriers. Carrier aggregation may also be referred to as multi-carrier operation. According to an aspect of the present disclosure, the wireless device 810 may be able to operate in low-band from 698 to 960 megahertz (MHz), mid-band from 1475 to 2170 MHz, and/or high-band from 2300 to 2690 MHz, ultra-high band from 3400 to 3800 MHz, and long term evolution (LTE) in LTE unlicensed bands (LTE-U/LAA) from 5550 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as long term evolution/universal mobile telecommunications service (LTE/universal mobile telecommunications service (UMTS)) bands and are listed in 3GPP TS 36.101. The wireless device 810 may be configured with up to 5 carriers in one or two bands in LTE Release 11.

FIG. 9 shows a block diagram of an exemplary design of a wireless device 900, such as the wireless device 810 shown in FIG. 8. FIG. 9 shows an example of a transceiver 960, which may be a wireless transceiver (WTR). In general, the conditioning of the signals in a transmitter 930 and a receiver 950 may be performed by one or more stages of amplifier(s), filter(s), upconverters, downconverters, and the like. These circuit blocks may be arranged differently from the configuration shown in FIG. 9. Furthermore, other circuit blocks not shown in FIG. 9 may also be used to condition the signals in the transmitter 930 and receiver 950. Unless otherwise noted, any signal in FIG. 9, or any other illustrations in the drawings, may be either single-ended or differential. Some circuit blocks in FIG. 9 may also be omitted.

In the example shown in FIG. 9, the wireless device 900 generally includes the transceiver 960 and a data processor 910. The data processor 910 may include a memory (not shown) to store data and program codes, and may generally include analog and digital processing elements. The transceiver 960 may include the transmitter 930 and receiver 950 that support bi-directional communication. In general, the wireless device 900 may include any number of transmitters and/or receivers for any number of communication systems and frequency bands. All or a portion of the transceiver 960 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 9, the transmitter 930 and the receiver 950 are implemented with the direct-conversion architecture.

In a transmit path, the data processor 910 processes data to be transmitted. The data processor 910 also provides in-phase (I) and quadrature (Q) analog output signals to the transmitter 930 in the transmit path. In an exemplary aspect, the data processor 910 includes digital-to-analog converters (DACs) 914a and 914b for converting digital signals generated by the data processor 910 into the in-phase (I) and quadrature (Q) analog output signals (e.g., I and Q output currents) for further processing.

Within the transmitter 930, lowpass filters 936a and 936b filter the in-phase (I) and quadrature (Q) analog transmit signals, respectively, to reduce undesired images caused by the prior digital-to-analog conversion. Amplifiers (Amp) 934a and 934b amplify the signals from lowpass filters 936a and 936b, respectively, and provide in-phase (I) and quadrature (Q) baseband signals. An upconverter 940 including upconversion mixers 941a and 941b upconverts the in-phase (I) and quadrature (Q) baseband signals with in-phase (I) and quadrature (Q) transmit (TX) local oscillator (LO) signals from a TX LO signal generator 990 to provide an upconverted signal. A filter 942 filters the upconverted signal to reduce undesired images caused by the frequency upconversion as well as interference in a receive frequency band. A power amplifier (PA) 944 amplifies the signal from filter 942 to obtain the desired output power level and provides a transmit radio frequency signal. The transmit radio frequency signal is routed through a duplexer/switch 946 and transmitted via an antenna 948.

In a receive path, the antenna 948 receives communication signals and provides a received radio frequency (RF) signal, which is routed through the duplexer/switch 946 and provided to a low noise amplifier (LNA) 956. The duplexer/switch 946 is designed to operate with a specific receive (RX) to transmit (TX) (RX-to-TX) duplexer frequency separation, such that RX signals are isolated from TX signals. The received RF signal is amplified by the LNA 952 and filtered by a filter 954 to obtain a desired RF input signal. Downconversion mixers 961a and 961b mix the output of the filter 954 with in-phase (I) and quadrature (Q) receive (RX) LO signals (i.e., LO_I and LO_Q) from an RX LO signal generator 980 to generate in-phase (I) and quadrature (Q) baseband signals. The in-phase (I) and quadrature (Q) baseband signals are amplified by amplifiers 926a and 926b and further filtered by lowpass filters 964a and 964b to obtain in-phase (I) and quadrature (Q) analog input signals, which are provided to the data processor 910. In the exemplary configuration shown, the data processor 910 includes analog-to-digital converters (ADCs) 916a and 916b for converting the analog input signals into digital signals for further processing by the data processor 910.

In FIG. 9, the transmit local oscillator (TX LO) signal generator 990 generates the in-phase (I) and quadrature (Q) TX LO signals used for frequency upconversion, while a receive local oscillator (RX LO) signal generator 980 generates the in-phase (I) and quadrature (Q) RX LO signals used for frequency downconversion. Each LO signal is a periodic signal with a particular fundamental frequency. A phase locked loop (PLL) 996 receives timing information from the data processor 910 and generates a control signal used to adjust the frequency and/or phase of the TX LO signals from the TX LO signal generator 990. Similarly, a PLL 986 receives timing information from the data processor 910 and generates a control signal used to adjust the frequency and/or phase of the RX LO signals from the RX LO signal generator 980.

The wireless device 900 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

FIG. 10 is a block diagram showing an exemplary wireless communication system 1000 in which a configuration of the disclosure may be advantageously employed. For purposes of illustration, FIG. 10 shows three remote units 1020, 1030, and 1080 and two base stations 1050. It will be recognized that wireless communication systems may have many more remote units and base stations. Remote units 1020, 1030, and 1080 include IC devices 1027A, 1027B, and 1027C that include the disclosed inductor. It will be recognized that other devices may also include the disclosed inductor, such as the base stations, switching devices, and network equipment. FIG. 10 shows forward link signals 1070 from the base station 1050 to the remote units 1020, 1030, and 1080 and reverse link signals 1090 from the remote units 1020, 1030, and 1080 to base station 1050.

In FIG. 10, remote unit 1020 is shown as a mobile telephone, remote unit 1030 is shown as a portable computer, and remote unit 1080 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the inductor.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A spiral inductor comprising:
a spiral trace; and
a plurality of first projections extending along a first edge of the spiral trace, wherein the plurality of first projections extend horizontally from the first edge of the spiral trace,
a plurality of second projections extending along and horizontally from a second edge of the spiral trace, the second edge being opposite the first edge,
wherein each of the plurality of first projections extends from the first edge by a first length, wherein each of the plurality of first projections is separated from an adjacent first projection by a first distance, wherein a ratio of the first length to the first distance is at least 1:1,
wherein each of the plurality of second projections extends from the second edge by a second length, wherein each of the plurality of second projections is separated from an adjacent second projection by a second distance, wherein a ratio of the second length to the second distance is at least 1:1, and
wherein the spiral trace has a first turn and a second turn, wherein the plurality of first projections along the first turn are interlaced with the plurality of second projections along the second turn by a third length to create capacitive coupling between the plurality of first projections and the plurality of second projections.

2. The spiral inductor of claim 1, wherein each of the plurality of first projections and each of the plurality of second projections has a rectangular shape.

3. The spiral inductor of claim 1, wherein the first distance is equal to the second distance.

4. The spiral inductor of claim 1, wherein the first length is equal to the second length.

5. The spiral inductor of claim 1, wherein the first edge is a top surface of the spiral trace and the plurality of first projections extend vertically from the top surface.

6. The spiral inductor of claim 5, wherein the plurality of second projections extend along and vertically from a bottom surface of the spiral trace.

7. The spiral inductor of claim 1, wherein the spiral inductor forms a power amplifier radio frequency (RF) choke inductor.

8. The spiral inductor of claim 1, integrated into a mobile phone, a set top box, a music player, a video player, an entertainment unit, a navigation device, a computer, a hand-held personal communication systems (PCS) unit, a portable data unit, and/or a fixed location data unit.

9. A co-spiral inductor comprising:
a first spiral trace; and
a second spiral trace disposed over the first spiral trace,
wherein each of the first spiral trace and the second spiral trace includes a plurality of first projections extending along a first edge of the spiral trace and a plurality of second projections extending along and horizontally from a second edge of the spiral trace, the second edge being opposite the first edge, and
wherein each of the first spiral trace and the second spiral trace has a first turn and a second turn, wherein the plurality of first projections along each of the first turns are interlaced with the plurality of second projections along each of the second turns by a first length to create capacitive coupling between the plurality of first projections and the plurality of second projections of the first spiral trace and the second spiral trace.

10. The co-spiral inductor of claim 9, wherein each of the plurality of first and second projections has a rectangular shape.

11. The co-spiral inductor of claim 9, wherein each of the plurality of first projections extends from the first edge by a second length, wherein each of the plurality of first projections is separated from an adjacent first projection by a first distance, wherein a ratio of the second length to the first distance is at least 1:1.

12. The co-spiral inductor of claim 1, wherein each of the plurality of first projections and each of the plurality of second projections has a rectangular shape.

13. The co-spiral inductor of claim 12, wherein each of the plurality of second projections extends from the second edge by a third length, wherein each of the plurality of second projections extends from the second edge by a third length, wherein each of the plurality of second projections is separated from an adjacent second projection by a second distance, wherein a ratio of the third length to the second distance is at least 1:1.

14. The co-spiral inductor of claim 13, wherein the first distance is equal to the second distance.

15. The co-spiral inductor of claim 13, wherein the second length is equal to the third length.

16. The co-spiral inductor of claim 9, wherein the co-spiral inductor forms a power amplifier RF choke inductor.

17. The co-spiral inductor of claim 9, integrated into a mobile phone, a set top box, a music player, a video player, an entertainment unit, a navigation device, a computer, a hand-held personal communication systems (PCS) unit, a portable data unit, and/or a fixed location data unit.

* * * * *